United States Patent
Diep et al.

(10) Patent No.: US 12,217,801 B2
(45) Date of Patent: Feb. 4, 2025

(54) BIAS VOLTAGE SCHEMES DURING PRE-PROGRAMMING AND PROGRAMMING PHASES

(71) Applicant: Micron Technology, Inc., Boise, ID (US)

(72) Inventors: Vinh Q. Diep, Hayward, CA (US);
Yingda Dong, Los Altos, CA (US);
Ching-Huang Lu, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 176 days.

(21) Appl. No.: 18/076,537

(22) Filed: Dec. 7, 2022

(65) Prior Publication Data

US 2023/0197164 A1    Jun. 22, 2023

Related U.S. Application Data

(60) Provisional application No. 63/292,052, filed on Dec. 21, 2021.

(51) Int. Cl.
| | | |
|---|---|---|
| *G11C 16/12* | (2006.01) | |
| *G11C 16/08* | (2006.01) | |
| *G11C 16/28* | (2006.01) | |
| *G11C 16/30* | (2006.01) | |

(52) U.S. Cl.
CPC ............. *G11C 16/12* (2013.01); *G11C 16/08* (2013.01); *G11C 16/28* (2013.01); *G11C 16/30* (2013.01)

(58) Field of Classification Search
CPC .......... G11C 16/12; G11C 16/08; G11C 16/28; G11C 16/30
See application file for complete search history.

(56) References Cited

U.S. PATENT DOCUMENTS

| | | | |
|---|---|---|---|
| 9,373,402 B2 * | 6/2016 | Yoo ....................... | G11C 29/021 |
| 10,559,368 B1 * | 2/2020 | Yang ....................... | G11C 16/08 |
| 10,777,279 B2 * | 9/2020 | Lee ....................... | G11C 16/0483 |
| 11,222,674 B2 * | 1/2022 | Li ........................... | G11C 16/06 |
| 2015/0221385 A1 * | 8/2015 | Ahn ....................... | G11C 16/14 |
| | | | 365/185.2 |
| 2021/0264964 A1 * | 8/2021 | Puthenthermadam ...................... | |
| | | | G11C 11/4094 |

* cited by examiner

*Primary Examiner* — Vanthu T Nguyen
(74) *Attorney, Agent, or Firm* — Lowenstein Sandler LLP

(57) ABSTRACT

Control logic can perform operations including obtaining, for each dummy wordline of a set of dummy wordlines, a respective set of step-up voltage parameters, wherein each set of step-up voltage parameters includes a step ratio corresponding to the dummy wordline, and causing a bias voltage with respect to each dummy wordline of the set of dummy wordlines to be ramped to a respective program inhibit bias voltage in accordance with the respective set of step-up voltage parameters. Additionally or alternatively, control logic can perform memory operations including causing a bias voltage with respect to each dummy wordline to be ramped to a power supply voltage during a seed first sub-phase of a pre-programming phase, and maintaining the bias voltage of the first dummy wordline at a first dummy wordline seed voltage throughout a bitline setting sub-phase of the pre-programming phase.

19 Claims, 9 Drawing Sheets

BIAS VOLTAGE SCHEMES DURING PRE-PROGRAMMING AND PROGRAMMING PHASES

RELATED APPLICATIONS

This application claims the benefit of U.S. Provisional Patent Application No. 63/292,052, filed on Dec. 21, 2021 and entitled "Bias Voltage Schemes During Pre-Programming and Programming Phases", the entire contents of which are incorporated by reference herein.

TECHNICAL FIELD

Embodiments of the disclosure relate generally to memory sub-systems, and more specifically, relate to bias voltage schemes during pre-programming and programming phases.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
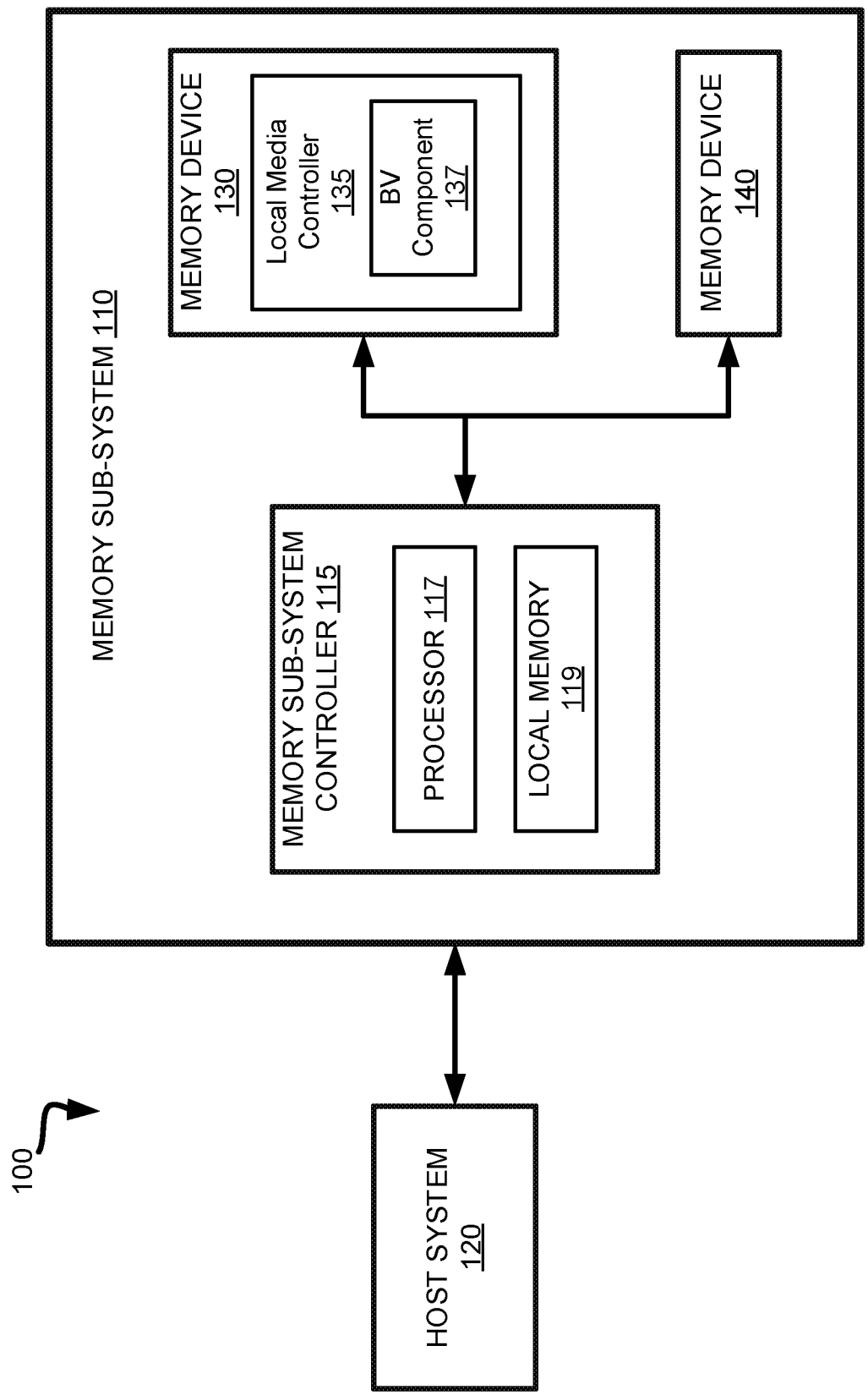
FIG. 1A illustrates an example computing system that includes a memory sub-system in accordance with some embodiments of the present disclosure.

Aspects of the present disclosure are directed to bias voltage schemes during pre-programming and programming phases. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can consist of one or more planes. For some types of non-volatile memory devices (e.g., NAND devices), each plane includes a set of physical blocks. Each block includes a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g. oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory device can include a number of dummy wordlines. One purpose of including dummy wordlines is to reduce hot carrier (e.g., electron or hole) injection that can be present in some memory devices (e.g., 3D memory devices) due to voltage differentials that exist during memory device programming. For example, one or more dummy wordlines can be disposed between a data wordline and a set of select gates connected to a common line (e.g., a bitline or a source line opposite the bitline). A select gate is a device (e.g., transistor) that selectively connects or disconnects a string of memory cells from the common line connected to the select gate. A select gate can be a drain-side select gate (SGD) or a source-side select gate (SGS). For example, the set of dummy wordlines can include a first dummy wordline adjacent to the set of select gates, a second dummy wordline adjacent to the first dummy wordline, and a third dummy wordline adjacent to the second dummy wordline and the data wordline.

Memory device programming can include a pre-programming phase and a programming phase. The pre-programming phase can include a number of sub-phases, including a "seed first" sub-phase, a "seed" sub-phase and a "bitline setting" sub-phase and a "programming" phase. During the seed first sub-phase, the voltage at each dummy wordline of the set of dummy wordlines can be maintained at 0 V, and a local media controller (e.g., NAND controller) can ramp the voltages of unselected and selected select gates to a power supply voltage (e.g, Vcc). An unselected select gate is a select gate that is connected to a string of memory cells that is not selected for programming, while a selected select gate is a select gate that is connected to a string of memory cells that is selected for programming.

During the seed sub-phase, the local media controller can ramp up the voltages with respect to each dummy wordline of the set of dummy wordlines to a dummy wordline seed voltage (Vdm_seed), while the voltage with respect to the unselected and selected select gates is ramped to a select gate seed voltage (Vsgd_seed). During the bitline setting sub-phase, the voltages with respect to the set of dummy wordlines and the unselected and selected select gates can be ramped down to 0 V.

However, during the pre-programming phase, post-cycling trap-up with respect to the set of dummy wordlines can exist during the seed first sub-phase, especially for the first dummy wordline adjacent to the select gate. Post-cycling trap-up refers to a cycling degradation phenomenon in which threshold voltages tend to be higher after a program cycle, which can increase vulnerability to read disturb. For example, post-cycling trap-up can result in lower VgVt, where VgVt is the difference between wordline voltage (Vg) and threshold voltage (Vt)). Post-cycling trap-up with respect to the set of dummy wordlines can, in turn, result in post-cycling trap-up with respect to the select gate. Additionally, coupling can exist between the first dummy wordline and the select gate during the bitline setting sub-phase.

During the programming phase, the local media controller can select at least one wordline for memory cells being programmed, and bias these memory cells by applying a programming pulse voltage (Vpgm). For example, Vpgm can range from about 16 V to about 20 V. The bitlines corresponding to the memory cells being programmed can be biased at about 0 V. Program inhibit is an operation performed during programming to prevent memory cells connected to at least one data wordline from being programmed by reducing program disturb with respect to memory cells. To inhibit programming of these memory cells, the channel potential can be driven to a high bias voltage, and the data wordline can be biased to a pass voltage (Vpass). For example, Vpass can be about 10 V. The bitlines connected to the inhibited memory cells can be biased at Vcc. For example, Vcc can be about 3 V. In some implementations, the at least one unselected data wordline is adjacent to a set of dummy wordlines. The local media controller can ramp the voltages with respect to the dummy wordlines and the unselected select gate up to respective bias voltage for program inhibit, while the voltage with respect to the selected select gate can be maintained at 0 V.

A potential gradient can exist between the high potential inside of the channel and the low potential outside of the channel. In some embodiments, the potential inside of the channel during program can be about 10 V, and the potential outside of the channel can be about −2 V. Such a potential gradient can generate electron-hole pairs, which can lead to hot carrier injection into memory cells. The hot carrier injection can result in a disturb phenomenon that can contribute to threshold voltage shift. Accordingly, minimizing the potential gradient can improve memory device functionality and longevity.

However, during programming, bias voltages are applied by a local media controller (e.g., NAND controller) with respect to the dummy wordlines. The bias voltages can have a fixed value for all programming pulse voltages (Vpgm). For example, a first bias voltage of about 4 V can be applied with respect to the first dummy wordline, a second bias voltage of about 6 V can be applied with respect to the second dummy wordline, and a third bias voltage of about 8 V can be applied with respect to the third dummy wordline. However, by applying fixed bias values with respect to the dummy wordlines for all Vpgm's, it may not be possible to minimize or smoothen the potential gradient with respect to lower values of Vpgm (e.g., 16 V) and higher values of Vpgm (e.g., 20 V).

Aspects of the present disclosure address the above and other deficiencies by implementing bias voltage schemes during programming. Some bias voltage schemes can be performed during the pre-programming phase, and some bias voltage schemes can be performed during the programming phase (e.g., during program inhibit). Each bias voltage scheme can be performed independently of any of the other bias voltage schemes described herein.

For example, a first bias voltage scheme can be implemented during the seed first and seed sub-phases to address post-cycling trap-up. During the first bias voltage scheme, instead of maintaining the dummy wordline voltage at 0 V during the seed first sub-phase until the seed sub-phase, the dummy wordline voltage is ramped to Vcc either at the same time as, or slightly before, the select gate during the seed first sub-phase. Additionally, the dummy wordline voltages are ramped to Vdm_seed by the end of the seed first sub-phase.

A second bias voltage scheme, independent of the first bias voltage scheme, can be implemented during the bitline setting sub-phase to reduce the coupling effects that may be present during the bitline setting sub-phase between the first dummy wordline and the select gate. During the second bias voltage scheme, the voltage with respect to the first dummy wordline (adjacent to the select gate) is maintained at Vdm_seed throughout the bitline setting sub-phase.

A third bias voltage scheme can be implemented to minimize or smoothen the potential gradient created during program inhibit. The third bias voltage scheme can implement a step-up voltage scheme, in which each bias voltage applied with respect to a respective dummy wordline is stepped up during program inhibit based on the value of Vpgm applied during programming. To implement the step-up scheme, an initial program inhibit bias voltage value, a maximum program inhibit bias voltage value (e.g., 4 V, 6V or 8V depending on the dummy wordline), and a bias voltage step ratio ("step ratio") can be defined for each dummy wordline. The step ratio controls the change in the bias voltage between the initial program inhibit bias voltage value and the maximum program inhibit bias voltage value. More specifically, each step ratio can be defined based on a change in Vpgm ($\Delta$Vpgm). For example, each step ratio can be proportional to $\Delta$Vpgm. In some embodiments, each step ratio is defined as a percentage of $\Delta$Vpgm. For example, the percentage can be 50% of $\Delta$Vpgm. As an illustration, assume that a first Vpgm is equal to 11 V and a second Vpgm is equal to 11.2 V, such that $\Delta$Vpgm is equal to 0.2 V (200 mV). A step ratio can be defined based on the $\Delta$Vpgm of 200 mV. For example, if a step ratio is defined as 50% of $\Delta$Vpgm, then the change in bias voltage for each step is 100 mV.

Advantages of the present disclosure include, but are not limited to, improved memory device programming performance and reliability.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a bias voltage (BV) component 137 that can implement bias voltage schemes during pre-programming and programming phases. For example, the BV component 137 can implement at least one of a first bias voltage scheme during the pre-programming phase to reduce post-cycling trap up effects, a second bias voltage scheme during the pre-programming phase to minimize coupling effects between dummy wordlines and the select gate, or a third bias voltage scheme during the programming phase to minimize or smoothen the potential gradient created during program inhibit. More specifically, the third bias voltage scheme can include a step-up bias voltage scheme that steps-up a bias voltage for each dummy wordline of the set of dummy wordlines to a program inhibit bias voltage utilizing a step ratio (e.g., from an initial program inhibit bias voltage to a maximum program inhibit voltage. Further details regarding the operations of the BV component 137 are described above, and will be described below with reference to FIGS. 4-6.

Figure 1B:
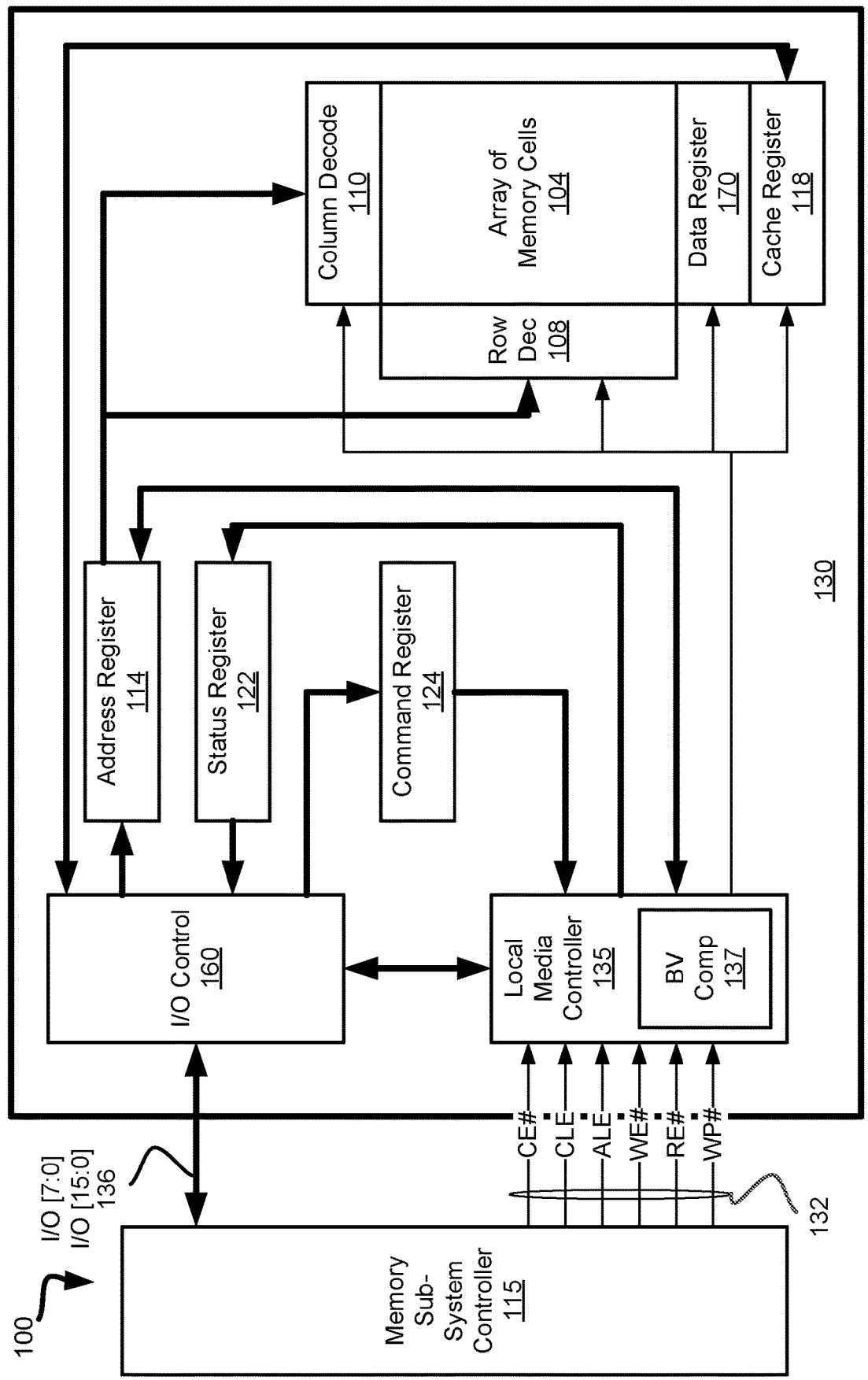
FIG. 1B is a block diagram of a memory device in communication with a memory sub-system controller of a memory sub-system in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 110 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, local media controller 135 includes the BV component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/P) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
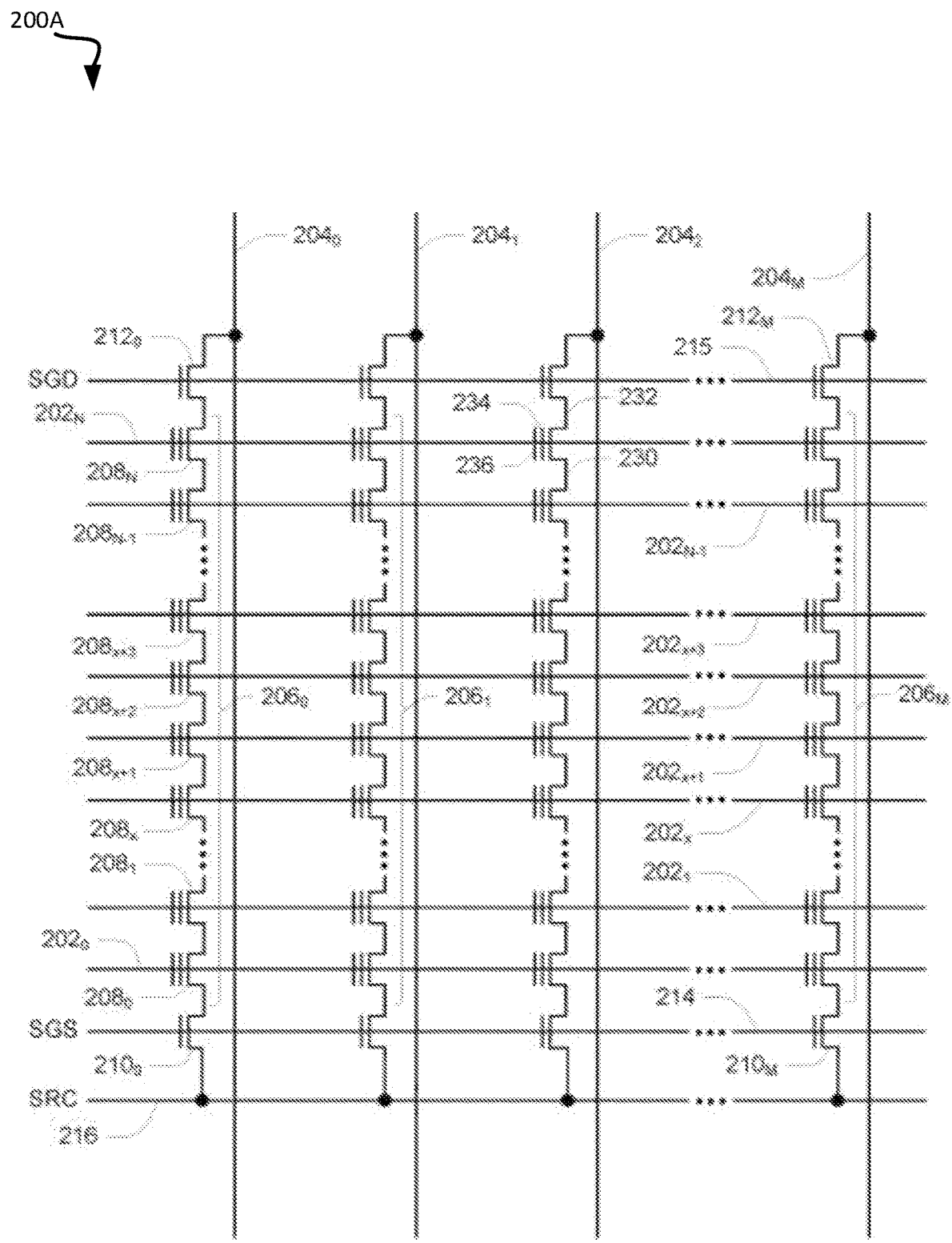
FIGS. 2A-2C are diagrams of portions of an example array of memory cells included in a memory device, in accordance with some embodiments of the present disclosure.
Figure 2B:
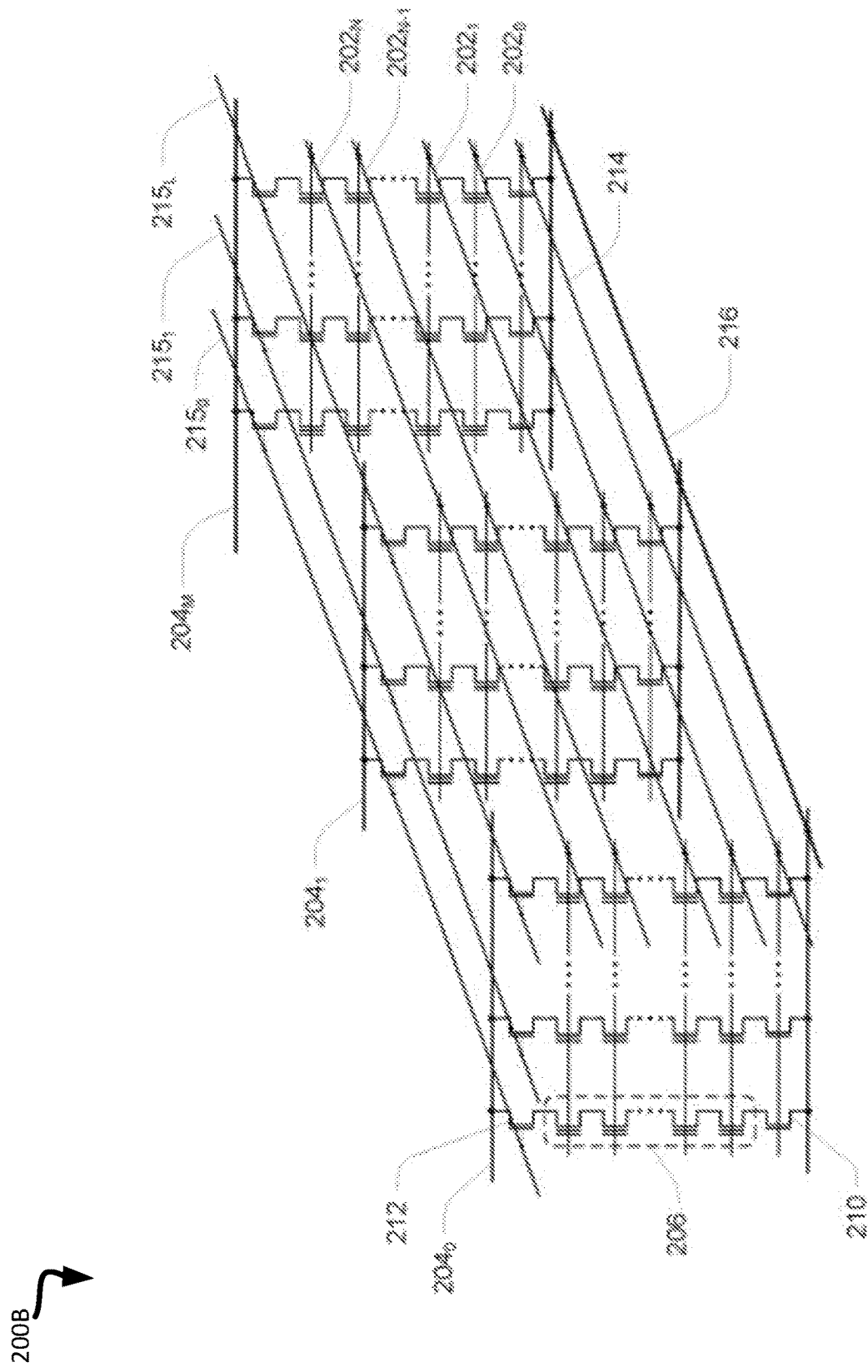
Figure 2C:
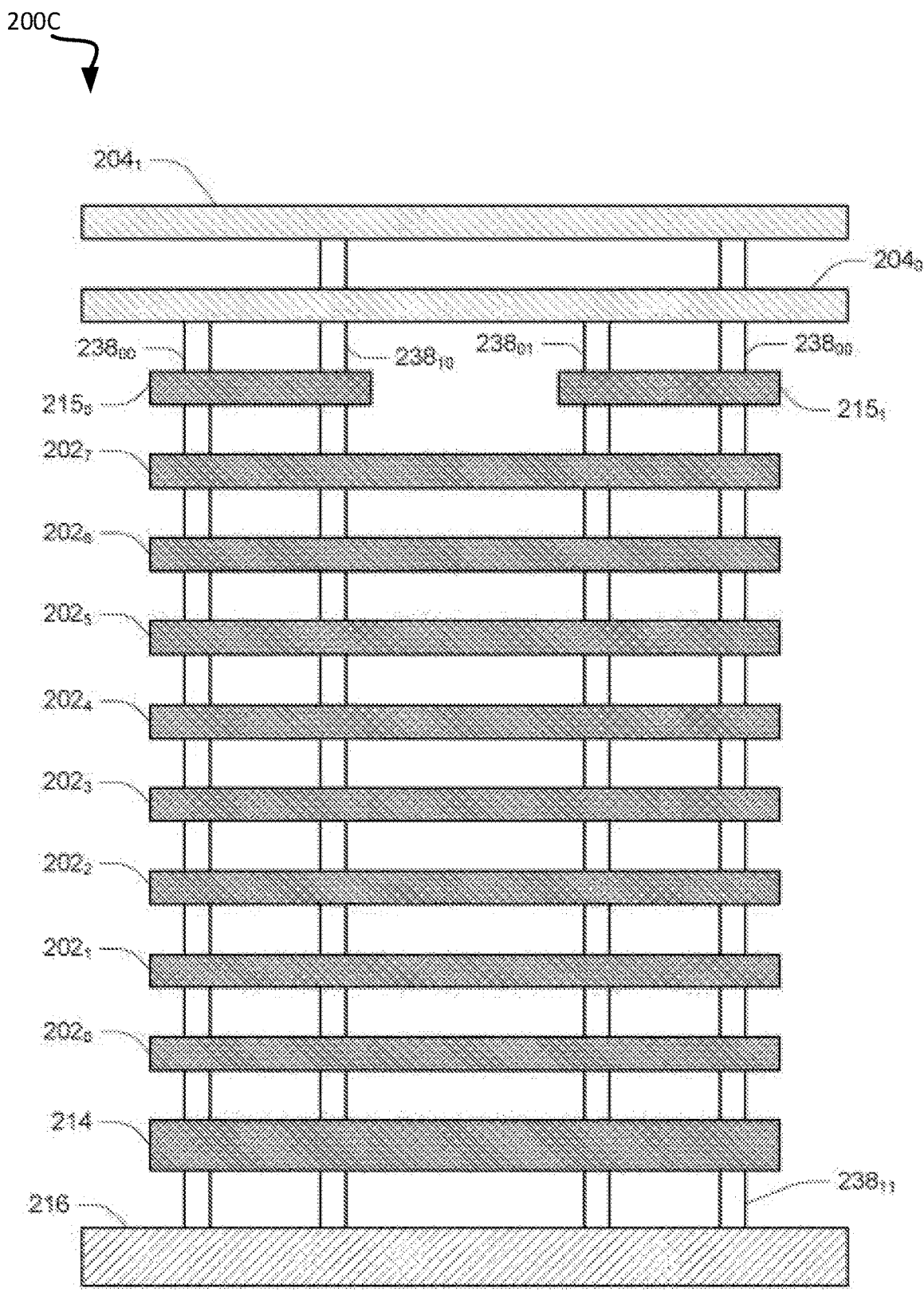

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Subsets of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2B) selectively connected to the bitline $204_0$. Similarly, channel regions $238_{10}$ and $238_{11}$ represent the channel regions of different strings of series-connected memory cells (e.g., NAND strings 206 of FIGS. 2A-2B) selectively connected to the bitline $204_1$. A memory cell (not depicted in FIG. 2C) may be formed at each intersection of an wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
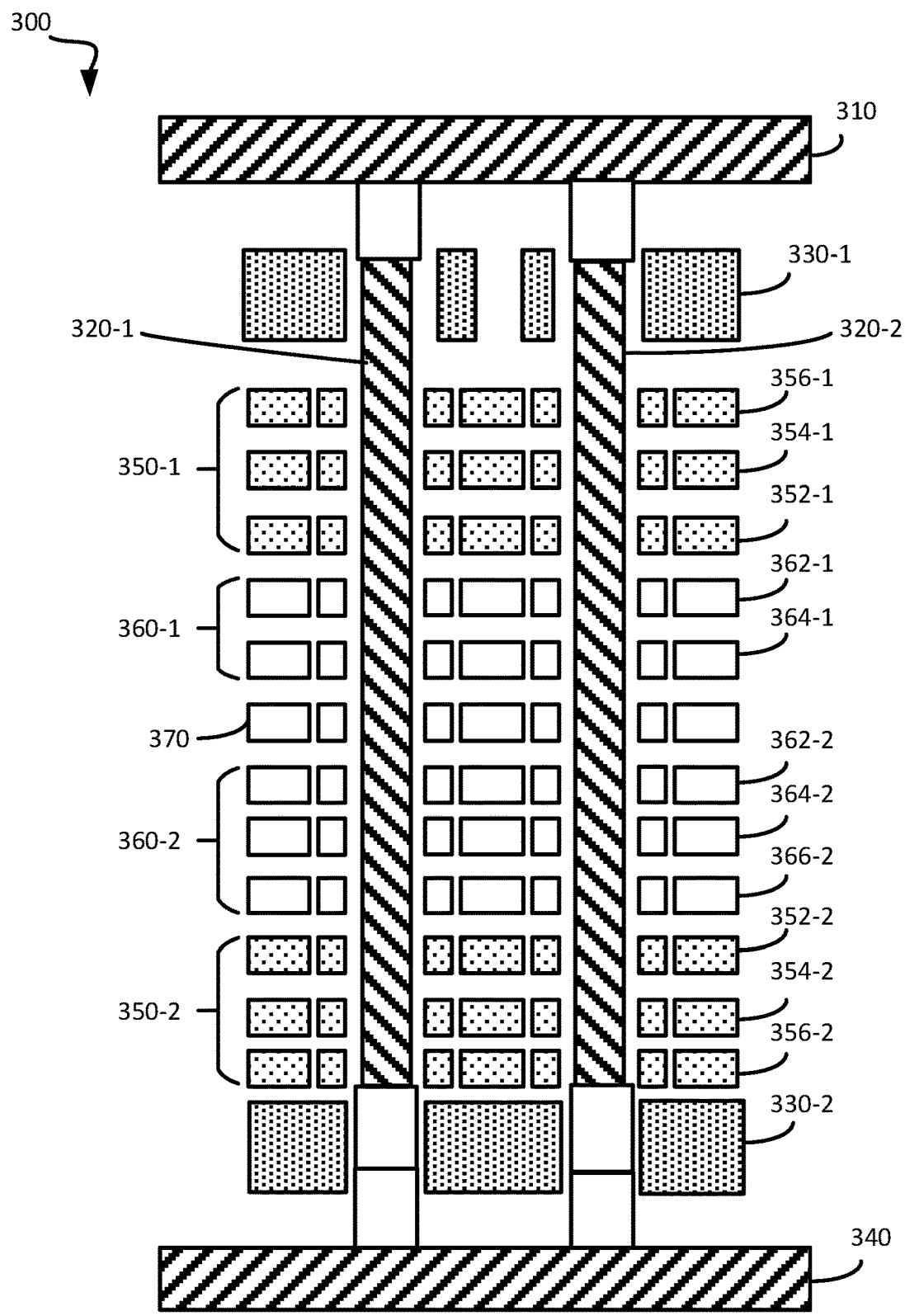
FIG. 3 is a diagram of an example three-dimensional (3D) memory device that can implement bias voltage schemes during pre-programming and programming phases, in accordance with some embodiments of the present disclosure.

FIG. 3 is a diagram of an example three-dimensional (3D) memory device ("device") 300 that can implement bias voltage schemes during program inhibit, in accordance with some embodiments of the present disclosure. In some embodiments, the device 300 is a 3D replacement gate memory device. However, the embodiments described herein can be applied to any suitable memory device.

As shown, the device 300 includes a bitline 310, pillars 320-1 and 320-2, select gates (SGs) 330-1 and 330-2, a source line (SRC) 340, and WL groups 350-1, 350-2, 360-1 and 360-2. For example, one of the SGs 330-1 and 330-2 can be a drain-side SG (SGD) and the other one of the SGs 330-1 and 330-2 can be a source-side SG (SGS). More specifically, WL groups 350-1 and 350-2 are dummy WL groups, and WL groups 360-1 and 360-2 are data WL groups. WL group 350-1 includes dummy WLs 352-1 through 366-1, WL group 350-2 includes dummy WLs 352-2 through 356-2, WL group 360-1 includes data WLs 362-1 and 364-1, and WL group 360-2 includes data WLs 362-2, 364-2 and 366-2. However, such an example should not be considered limiting. A data WL is connected to memory cells that are used as data storage elements to perform operations (e.g., read, programming), while a dummy WL is connected to memory cells that are not used as a data storage elements, and thus are not used to perform operations.

As further shown, a WL 370 is provided. In some embodiments, the device 300 is a multiple tier device, in which WL groups 350-1 and 360-1 are associated with a first tier of memory cells of the device 300 and the WL groups 350-2 and 360-2 are associated with a second tier of memory cells of the device 300, such that the WL 370 corresponds to a dummy WL separating the WL groups 360-1 and 360-2. More specifically, the first tier and the second tier can be vertically stacked relative to each other. For example, the first tier can be an upper tier and the second tier can be a lower tier. In other embodiments, the device 300 is a "single tier" device, in which the WL groups 360-1 and 360-2 are not arranged in tier. In single tier embodiments, the WL 370 can be an active WL within one of the WL groups 360-1 or 360-2.

Illustratively, assume that data wordline 362-1 is inhibited during programming. Dummy WL 356-1 can be referred to as first dummy WL (DM0), dummy WL 354-1 can be referred to as a second dummy WL (DM1), and dummy WL 352-1 can be referred to as a third dummy WL (DM2). Bias voltage schemes performed during pre-programming and/or programming phases will now be described in further detail below with reference to FIG. 4.

Figure 4:
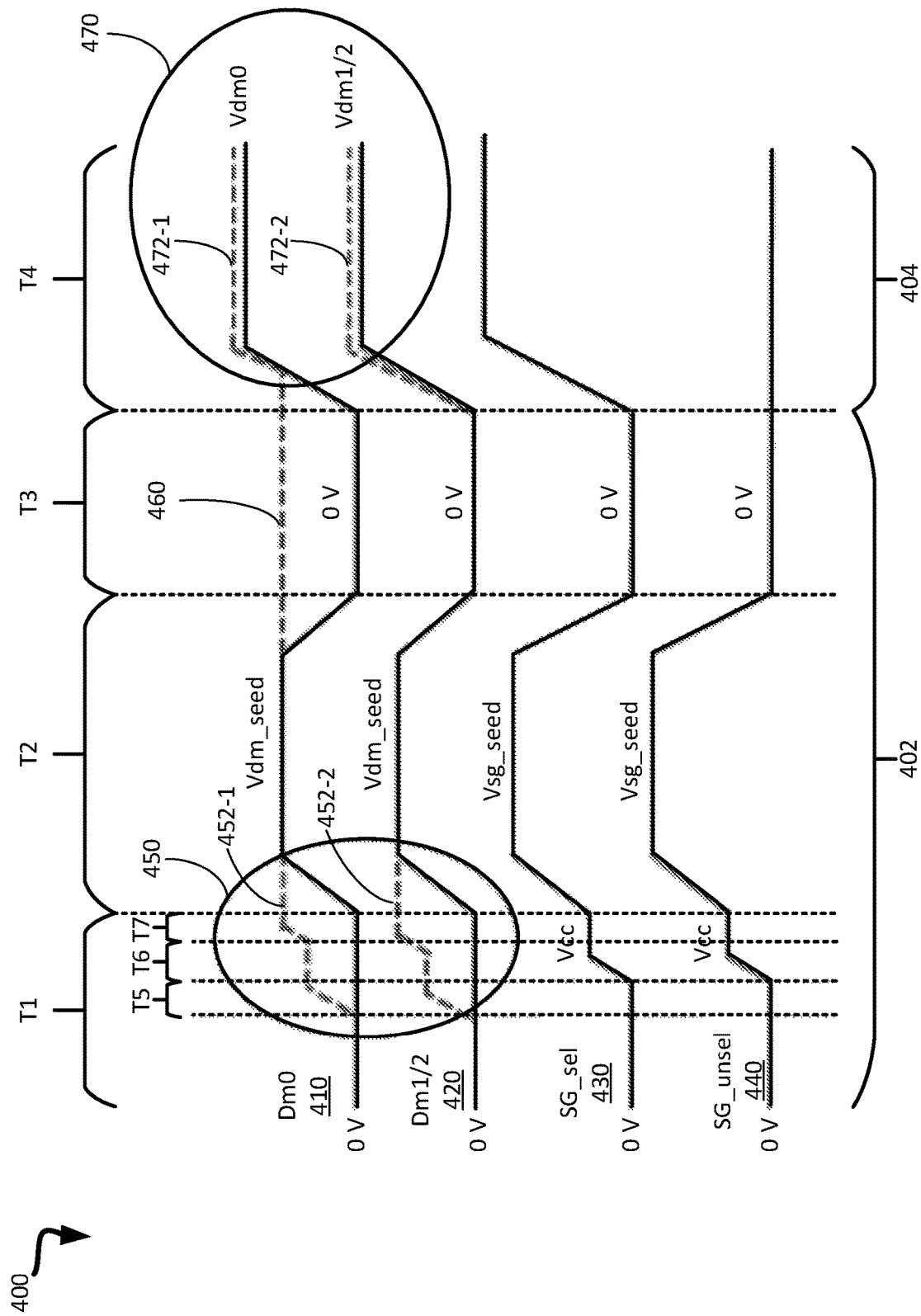
FIG. 4 is a timing diagram illustrating example bias voltage schemes during pre-programming and programming phases, in accordance with some embodiments of the present disclosure

FIG. 4 is a timing diagram 400 illustrating example bias voltage schemes during pre-programming and programming phases, in accordance with some embodiments of the present disclosure. The diagram 400 illustrates pairs of waveforms corresponding to respective dummy cells, including a pair of waveforms corresponding to a dummy cell of a first dummy wordline (Dm0) 410, and a pair of waveforms corresponding to a dummy cell of at least one of a second dummy wordline (Dm1) or a third dummy wordline (Dm2) 420. The diagram 400 further illustrates a waveform corresponding to a selected select gate (SG_sel) 430, and a waveform corresponding to an unselected select gate (SG_unsel) 440. In some embodiments, the select gates 430 and 440 include drain-side select gates (SGD's). In some embodiments, the select gates 430 and 440 include source-side select gates (SGS's). The solid waveforms shown in diagram 400 are indicative of waveforms generated in accordance with conventional program inhibit operations, while the dashed waveforms shown in diagram 400 are indicative of waveforms generated in accordance with program inhibit operations described herein.

The diagram 400 shows a number of time periods "T1" through "T4". Time periods T1-T3 correspond to a pre-programming phase 402, and T4 corresponds to a programming phase 404 performed after the pre-programming phase 402. Each time period T1-T3 corresponds to a sub-phase performed during the pre-programming phase 402. For example, T1 corresponds to a first sub-phase, which is referred to as a "seed first" sub-phase. T2 corresponds to a second operation, which is referred to as a "seed voltage" sub-phase. T3 corresponds to a "bitline setting" sub-phase in which the bitline voltage level is allowed to settle to its intended voltage level. Program inhibit can be performed during the programming phase 404.

During T1, as indicated by the solid waveforms, the dummy cells are biased to ground (e.g., 0V), and the SGs are ramped up to an outside channel potential (Vcc). During T2, as indicated by the solid waveforms, the cells of the dummy wordlines are ramped from 0 V to a dummy seed bias voltage (Vdm_seed) (e.g., 3 V), and the select gates are ramped from Vcc to a select gate seed bias voltage (Vsg_seed) (e.g., 3 V). Then, the voltages of the cells of the dummy wordlines and the select gates are ramped back down to 0 V at the end of T2. During T3, as indicated by the solid waveforms, the cells of the dummy wordlines and the SGs are maintained at 0 V during the bitline setting sub-phase.

However, during T1, since all of the cells of the data wordlines are ground, the channel potential can be negative. If the threshold voltage of the cell of DM0 is high, the channel potential can lead to a larger potential difference between inside the channel and outside of the channel (Vcc). Such a larger potential difference can contribute to additional hot carrier generation, as well as select gate trap-up. During T3, for bitlines near a string driver, which is a device that applies voltages to the wordlines, the effect of coupling can be minimized since DM0 and the SG adjacent to DM0 can quickly achieve their bias voltages. However, when bitlines are far away from the string driver, the effect of coupling during T3 can be amplified as the DM0 ramping can couple to the SG and thus weakly turn on the cells. To address at least the above-noted drawbacks, a first bias voltage scheme can be performed during T1/T2 to suppress post-cycling trap-up by reducing (e.g., flattening) the channel potential difference between the cells of the dummy wordlines 410 and 420 and Vcc when the select gate is turned on to enable Vcc to enter the channel during T1, And a second bias voltage scheme can be performed to reduce the effect of coupling during T3.

During the first bias voltage scheme, as shown in this illustrative example with respect to the set of dashed waveforms 450 including dashed waveform 452-1 corresponding to the dummy wordline 410 and dashed waveform 452-2 corresponding to the dummy wordline 420, the cells of the dummy wordlines 410 and 420 can be ramped up to Vcc during some time period T5 (which can be slightly earlier than, or at least at the same time as, as the select gate ramping to Vcc). The voltage of the cells of the dummy wordlines 410 and 420 can be maintained at Vcc during some time period T6. Then, the voltage of the cells of the dummy wordlines 452-1 and 452-2 can be ramped to Vdm_seed during some time period T7 prior to T2.

During the second bias voltage scheme, as shown in this illustrative example with respect to the dashed waveform 460, instead of ramping the voltage of the cell of DM0 to 0 V, the voltage of the cell of the dummy wordline 410 can be maintained at the seed bias voltage achieved during T2 until some time period within T4. By doing so, the threshold voltage swing corresponding to the dummy wordline 410 will be reduced, which can reduce the coupling effect.

During T4, as indicated by the solid waveforms, the voltages of the cells of the dummy wordlines 410 and 420 are ramped to respective bias voltages Vdm0 and Vdm1/2, the voltage of SGD_Sel is ramped to a bias voltage Vsg, and the voltage of SGD_Unsel is maintained at 0 V. However, as mentioned above, a potential gradient can exist due to the potential differential between the high voltage inside of the channel and the low voltage outside of the channel, which can lead to hot carrier injection into memory cells. The hot carrier injection can result in a disturb phenomenon that can lead to threshold voltage shift. As further described above, bias voltages can have a fixed value for all programming pulse voltages (Vpgm). For example, a first bias voltage of about 4 V can be applied with respect to the first dummy wordline, a second bias voltage of about 6 V can be applied with respect to the second dummy wordline, and a third bias voltage of about 8 V can be applied with respect to the third dummy wordline. However, by applying fixed bias values with respect to the dummy wordlines for all Vpgm's, it may not be possible to minimize or smoothen the potential gradient with respect to lower values of Vpgm (e.g., 16 V) and higher values of Vpgm (e.g., 20 V). Accordingly, minimizing the potential gradient can improve memory device functionality.

A third bias voltage scheme can be performed during the programming phase (T4) to minimize or smoothen the potential gradient created during program inhibit. For example, as shown in this illustrative example as indicated by the set of dashed waveforms including dashed waveform 472-1 corresponding to the dummy wordline 410 and the dashed waveform 472-2 corresponding to the dummy wordline 420, the cells of the dummy wordlines 410 and 420 can be ramped up to their respective bias voltages Vdm0 and Vdm1/2, which can be higher than the bias voltages achieved during T4. Additionally, the bias voltage for the dummy wordline 410, Vdm0, is ramped up from Vdm_seed achieved during T3.

The third bias voltage scheme can implement a step-up bias voltage scheme to step-up each bias voltage applied with respect to the dummy wordlines 410 and 420. To implement the step-up bias voltage scheme, an initial program inhibit bias voltage value, a maximum program inhibit bias voltage value, and a bias voltage step ratio ("step ratio") can be defined for each of the dummy wordlines (e.g. DM0, DM1 and DM2). Each step ratio can be determined based on changes in programming pulse voltage ($\Delta$Vpgm). Further details regarding the step-up bias voltage scheme will now be described below with reference to FIG. 5.

Figure 5:
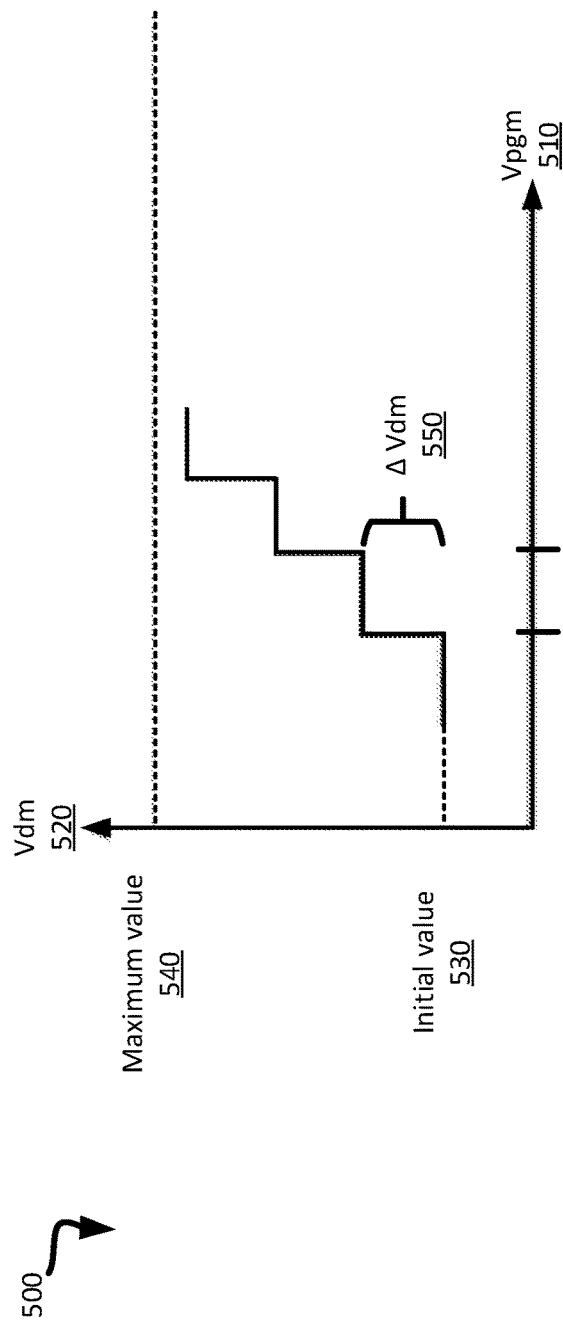
FIG. 5 is a graph illustrating an example step-up bias voltage scheme implemented during program inhibit, in accordance with some embodiments of the present disclosure.

FIG. 5 is a graph 500 illustrating an example step-up bias voltage scheme implemented during program inhibit, in accordance with some embodiments of the present disclosure. For example, the step-up bias voltage scheme can be performed during the programming phase (e.g. time period T4) described above with reference to FIG. 4 to minimize or smoothen the potential gradient created during program inhibit.

As shown, the graph 500 includes an X-axis corresponding to programming pulse voltage (Vpgm) 510 and a Y-axis corresponding to bias voltage 520 applied to a given dummy wordline (e.g., DM0, DM1 or DM2). As further shown, an initial program inhibit bias voltage value ("initial value") 530 and a maximum program inhibit bias voltage value ("maximum value") 540 are designated along the Y-axis. For example, if the dummy wordline is DM0, the initial value 530 can be about 2 V and the maximum value 540 can be about 4 V. Additionally, the graph 500 further shows a voltage steps ($\Delta$Vdm) between the initial value 530 and the maximum value 540, including $\Delta$Vdm 550, defined by a step ratio for the dummy wordline.

The step ratio for each dummy wordline can be determined based on a change in Vpgm ($\Delta$Vpgm) 560. For example, the step ratio can be proportional to $\Delta$Vpgm 560. In some embodiments, each step ratio is defined as a percentage of $\Delta$Vpgm 560. For example, the percentage can be 50% of $\Delta$Vpgm 560. As an illustration, assume that a first Vpgm is equal to 11 V and a second Vpgm is equal to 11.2 V, such that $\Delta$Vpgm 560 is equal to 0.2 V (200 mV). If the step ratio is defined as 50% of $\Delta$Vpgm 560, then $\Delta$Vdm 550 can be 100 mV.

In some embodiments, the step ratio for each of the dummy wordlines is the same. For example, the step ratio for each of the dummy wordlines (e.g., DM0, DM1 and DM2) can be defined based on a same percentage of $\Delta$Vpgm. As an illustrative example, the initial value 530 and the maximum value 540 for DM0 can be 2 V and 4 V, respectively, the initial value 530 and the maximum value 540 for DM1 can be 4 V and 6 V, respectively, and the initial program inhibit bias voltage value and the maximum program inhibit bias voltage value for DM2 can be 6 V and 8 V, respectively. In this example, the step values for each of the dummy wordlines can be 2 V.

In some embodiments, the step ratio for at least one of the dummy wordlines is different. For example, a first step ratio corresponding to DM0 can be defined based on a first percentage of $\Delta$Vpgm, a second step ratio corresponding to DM1 can be defined based on a second percentage of $\Delta$Vpgm, and a third step ratio corresponding to DM2 can be defined based on a third percentage of $\Delta$Vpgm, where at least one of the step ratios is different. Illustratively, the first step ratio can be 50% of $\Delta$Vpgm, while the second step ratio and the third step ratio can be 75% of $\Delta$Vpgm.

Figure 6:
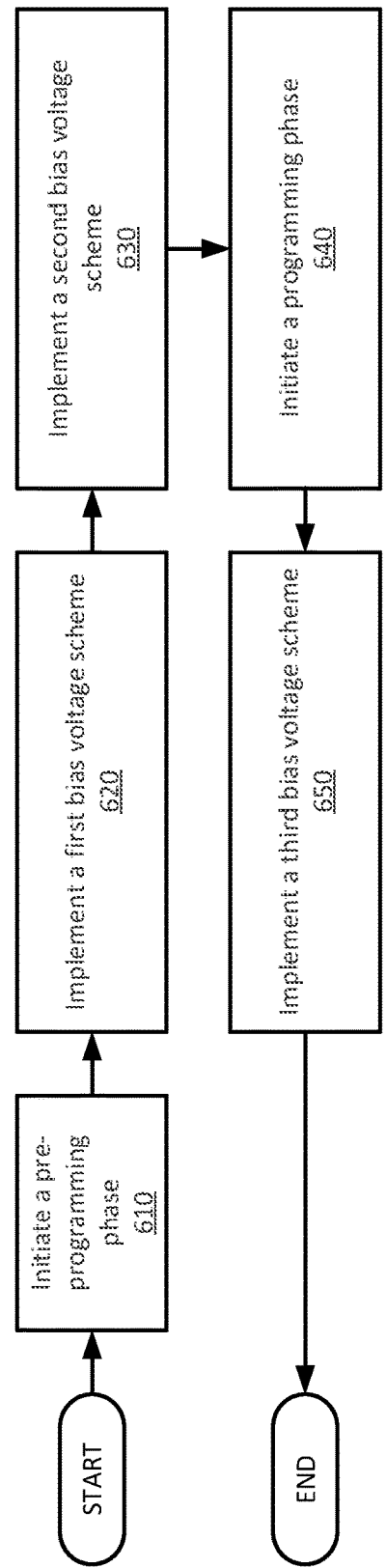
FIG. 6 is a flow diagram of a method to implement example dummy wordline bias voltage schemes during pre-programming and programming phases, in accordance with some embodiments of the present disclosure.

FIG. 6 is a flow diagram of an example method 600 to implement an example bias voltage scheme during program inhibit, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the BV component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a pre-programming phase is initiated. For example, processing logic can cause the pre-programming phase to be initiated. The pre-programming phase can include a number of sub-phases, including a seed first sub-phase, a seed sub-phase and a bitline setting sub-phase. Further details regarding the pre-programming phase are described above with reference to FIG. 4.

At operation 620, a first bias voltage scheme is implemented. For example, the processing logic can cause the first bias voltage scheme to be implemented during the pre-programming phase. Causing the first bias voltage scheme to be implemented during the pre-programming phase can include causing a bias voltage with respect to each dummy wordline of a set of dummy wordlines to be ramped to a power supply voltage (e.g., Vcc) during a seed first sub-phase of the pre-programming phase. The set dummy wordlines can be disposed between a select gate and a data wordline. For example, the set of dummy wordlines can include a first dummy wordline adjacent (e.g., directly next to) to the select gate (e.g., Dm0), a second dummy wordline adjacent to the first dummy wordline (e.g., Dm1), and a third dummy wordline adjacent to the second dummy wordline (e.g., Dm2).

The bias voltage can from ramped from 0 V to the power supply voltage. In some embodiments, causing the first bias voltage scheme to be implemented includes simultaneously ramping the bias voltage of the select gate and each dummy wordline of the set of dummy wordlines from 0 V to the power supply voltage. In some embodiments, causing the first bias voltage scheme to be implemented includes causing the bias voltage of each dummy wordline of the set of dummy wordlines to be ramped to the power supply voltage before ramping the bias voltage of the select gate from 0 V to the power supply voltage.

Causing the first bias voltage scheme to be implemented can further include causing the bias voltage of each dummy wordline of the set of dummy wordlines to be ramped from the power supply voltage to a respective dummy wordline seed voltage (Vdm_seed). For example, the bias voltage of the first dummy wordline can be ramped to a first dummy wordline seed voltage, the bias voltage of the second dummy wordline can be ramped to a second dummy wordline seed voltage, and the bias voltage of the third dummy wordline can be ramped to a third dummy wordline seed voltage. More specifically, the bias voltage of each dummy wordline of the set of dummy wordlines can be ramped to the respective dummy wordline seed voltage by the end of the seed first sub-phase (instead of during the seed sub-phase).

Therefore, the first bias voltage scheme can reduce post-cycle trap-up effects between the select gate and the dummy wordline adjacent to the select gate by reducing (e.g., flattening) the channel potential difference between the select gate and the dummy wordline adjacent to the select gate. Further details regarding the first bias voltage scheme are described above with reference to FIG. 4.

At operation 630, a second bias voltage scheme is implemented. For example, the processing logic can cause the second bias voltage scheme to be implemented with respect to the set of dummy wordlines during the pre-programming phase. Causing the second bias voltage scheme to be implemented during the pre-programming phase can include maintaining the bias voltage of the first dummy wordline at the first dummy wordline seed voltage throughout a bitline setting sub-phase of the pre-programming phase. Causing the second bias voltage scheme to be implemented during the pre-programming phase can further include causing, prior to the bitline setting sub-phase, the bias voltage of the second dummy wordline and the bias voltage of the third dummy wordline to each be ramped down to 0 V from the second dummy wordline seed voltage and the third dummy wordline seed voltage, respectively. Bias voltages with respect to the second and third dummy wordlines can be maintained at 0 V during the bitline setting sub-phase. The second bias voltage scheme can minimize coupling effects between the select gate and the dummy wordline adjacent to the select gate. As will be described below with respect to operations 640-650, during a programming phase, the bias voltage of each dummy wordline can be ramped to a respective program inhibit bias voltage. For example, the bias voltage of the first dummy wordline can be ramped from the first dummy wordline seed voltage to a first program inhibit bias voltage, and the bias voltages of the first and second dummy wordlines can be ramped from 0 V to respective second and third program inhibit bias voltages. Further details regarding the second bias voltage scheme are described above with reference to FIG. 4.

At operation 640, a programming phase is initiated. For example, processing logic can cause the programming phase to be initiated. Program inhibit can be performed during the programming phase to inhibit the programming of at least one data wordline. Further details regarding the programming phase are described above with reference to FIG. 4.

At operation 650, a third bias voltage scheme is implemented during the programming phase. For example, the processing logic can cause the third bias voltage scheme to be implemented during the programming phase. Causing the third bias voltage scheme to be implemented can include obtaining, for each dummy wordline of the set of dummy wordlines, a respective set of step-up voltage parameters, and causing a bias voltage with respect to each dummy wordline of the set of dummy wordlines to be ramped to a respective program inhibit bias voltage in accordance with the respective set of step-up voltage parameters. More specifically, the third bias voltage can be a step-up bias voltage scheme that steps-up the bias voltage applied with respect to each dummy wordline of the set of dummy wordlines.

For example, each set of step-up voltage parameters can include a step ratio corresponding to the dummy wordline. In some embodiments, each set of step-up voltage parameters can further include an initial program inhibit bias voltage value, a maximum program inhibit bias voltage value, and a step ratio. Each step ratio can be determined based on a change in programming pulse voltage ($\Delta Vpgm$). In some embodiments, each step ratio is determined as a percentage of $\Delta Vpgm$. For example, the first dummy wordline can correspond to a first step ratio and a first program inhibit bias voltage, the second dummy wordline can correspond to a second step ratio and a second program inhibit bias voltage and the third dummy wordline can correspond to a third step ratio and a third program inhibit bias. In some embodiments, each of the first step ratio, the second step ratio and third step ratio is the same. In some embodiments, at least one of the first step ratio, the second step ratio and the third step ratio is different.

Causing the bias voltage of each dummy wordline of the set of dummy wordlines to be ramped to the respective program inhibit bias voltage can include causing the bias voltage of the first dummy wordline to be ramped to a first program inhibit bias voltage from the first seed voltage maintained through the bitline setting sub-phase described above, and causing the bias voltages with respect to the second and third dummy wordlines to be ramped from 0 V to second and third program inhibit bias voltages, respectively. The first program inhibit bias voltage can be less than the second program inhibit bias voltage, and the second program inhibit bias voltage can be less than the third program inhibit bias voltage. In some embodiments, the first program inhibit bias voltage is about 4 V, the second program inhibit bias voltage is about 6 V, and the third program inhibit bias voltage is about 8 V. The third bias voltage scheme can minimize or smoothen the potential gradient created during program inhibit. Further details regarding the third bias voltage scheme are described above with reference to FIGS. 4-5.

Figure 7:
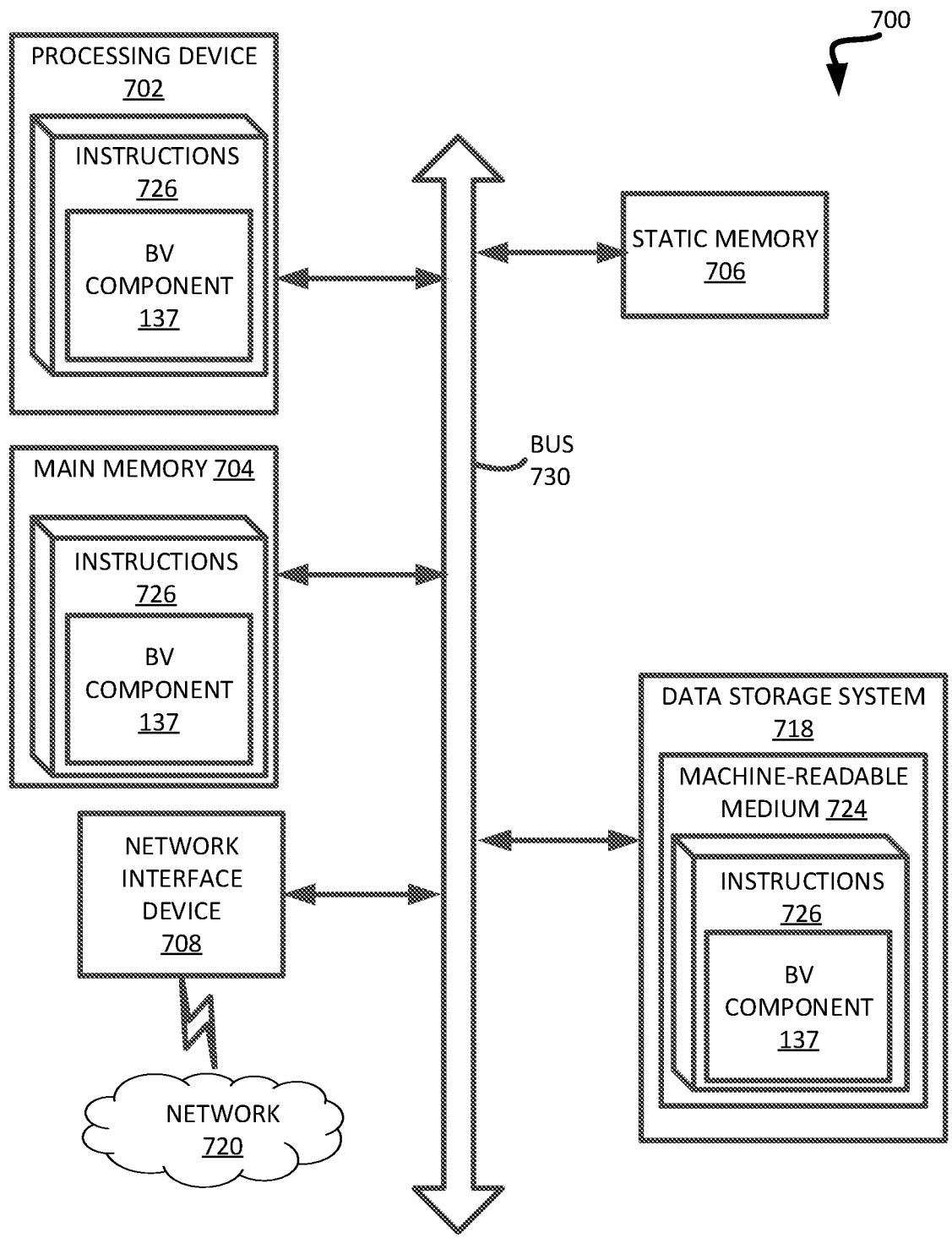
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the BV component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 508 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a BV component (e.g., the BV component 137 of FIG. IA). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

causing, by a processing device, a first bias voltage with respect to a first dummy wordline of a set of dummy wordlines of a memory array to be ramped to a power supply voltage during a seed first sub-phase of a pre-programming phase, wherein the first dummy wordline is adjacent to a select gate of the memory array;

maintaining, by the processing device, the first bias voltage at a first dummy wordline seed voltage throughout a bitline setting sub-phase of the pre-programming phase, wherein the first bias voltage is ramped from the power supply voltage to the first dummy wordline seed voltage; and causing, by a processing device during a programming phase, the first bias voltage to be ramped from the first dummy wordline seed voltage to a program inhibit bias voltage.

2. The method of claim 1, wherein the causing the first bias voltage to be ramped to the power supply voltage during the seed first sub-phase further comprises simultaneously ramping a select gate bias voltage with respect to the select gate and the first bias voltage from 0 V to the power supply voltage.

3. The method of claim 1, wherein causing the first bias voltage to be ramped to the power supply voltage during the seed first sub-phase further comprises causing the first bias voltage to be ramped to the power supply voltage before ramping a select gate bias voltage with respect to the select gate from 0 V to the power supply voltage.

4. The method of claim 1, wherein the set of dummy wordlines further comprises a second dummy wordline adjacent to the first dummy wordline, and a third dummy wordline adjacent to the second dummy wordline.

5. The method of claim 4, further comprising:
causing, by the processing device, a second bias voltage with respect to the second dummy wordline and a third bias voltage with respect to the third dummy wordline to be ramped from the power supply voltage to a second dummy wordline seed voltage and a third dummy wordline seed voltage, respectively.

6. The method of claim 5, further comprising:
causing, by the processing device prior to the bitline setting sub-phase, the second bias voltage and the third bias voltage to each be ramped down to 0 V from the second dummy wordline seed voltage and the third dummy wordline seed voltage, respectively.

7. The method of claim 1, wherein the first bias voltage is ramped from the first dummy wordline seed voltage to the first program inhibit bias voltage in accordance with a first set of step-up voltage parameters, and wherein the first set of step-up voltage parameters comprises a first step ratio defined based on a change in programming pulse voltage.

8. A memory device comprising:
a memory array comprising a select gate, and a set of memory cells corresponding to a set of dummy wordlines, the set of dummy wordlines comprising a first dummy wordline adjacent to the select gate; and
control logic, operatively coupled with the memory array, to perform memory programming operations comprising at least one of:
causing a first bias voltage with respect to the first dummy wordline to be ramped to a power supply voltage during a seed first sub-phase of a pre-programming phase;
maintaining the first bias voltage at a first dummy wordline seed voltage throughout a bitline setting sub-phase of the pre-programming phase, wherein the first bias voltage is ramped from the power supply voltage to the first dummy wordline seed voltage; and
causing, during a programming phase, the first bias voltage to be ramped from the first dummy wordline seed voltage to a program inhibit bias voltage.

9. The memory device of claim 8, wherein causing the first bias voltage to be ramped to the power supply voltage during the seed first sub-phase further comprises simultaneously ramping a select gate bias voltage with respect to the select gate and the first bias voltage from 0 V to the power supply voltage.

10. The memory device of claim 8, wherein causing the first bias voltage to be ramped to the power supply voltage during the seed first sub-phase further comprises causing the first bias voltage to be ramped to the power supply voltage before ramping a select gate bias voltage with respect to the select gate from 0 V to the power supply voltage.

11. The memory device of claim 8, wherein the set of dummy wordlines further comprises a second dummy wordline adjacent to the first dummy wordline, and a third dummy wordline adjacent to the second dummy wordline.

12. The memory device of claim 11, wherein the memory programming operations further comprise causing a second bias voltage with respect to the second dummy wordline and a third bias voltage with respect to the third dummy wordline be ramped from the power supply voltage to a second dummy wordline seed voltage and a third dummy wordline seed voltage, respectively.

13. The memory device of claim 12, wherein the memory programming operations further comprise causing, prior to the bitline setting sub-phase, the second bias voltage and the third bias voltage to each be ramped down to 0 V from the second dummy wordline seed voltage and the third dummy wordline seed voltage, respectively.

14. A method comprising:
causing, by a processing device, a bias voltage with respect to each dummy wordline of a set of dummy wordlines to be ramped to a power supply voltage during a seed first sub-phase of a pre-programming phase, wherein the set of dummy wordlines comprises a first dummy wordline adjacent to a select gate;
causing, by the processing device, the bias voltage with respect to the first dummy wordline to be ramped from the power supply voltage to a first dummy wordline seed voltage;
maintaining, by the processing device, the bias voltage with respect to the first dummy wordline at the first dummy wordline seed voltage throughout a bitline setting sub-phase of the pre-programming phase; and
causing, by the processing device, the bias voltage with respect to the first dummy wordline to be ramped from the first dummy wordline seed voltage to a first program inhibit bias voltage in accordance with a first set of step-up voltage parameters, wherein the first set of step-up voltage parameters comprises a first step ratio defined based on a change in programming pulse voltage.

15. The method of claim 14, wherein the first set of step-up voltage parameters further comprises an initial program inhibit bias voltage value and a maximum program inhibit bias voltage value, and wherein the first step ratio is defined based on a change in programming pulse voltage.

16. The method of claim 14, wherein the set of dummy wordlines further a second dummy wordline adjacent to the first dummy wordline, and a third dummy wordline adjacent to the second dummy wordline.

17. The method of claim 16, further comprising:
causing, by the processing device, the bias voltage with respect to the second dummy wordline and the bias voltage with respect to the third dummy wordline to be ramped from 0 V to a second program inhibit bias voltage and third program inhibit bias voltage, respectively;
wherein the first program inhibit bias voltage is less than the second program inhibit bias voltage, and the second program inhibit bias voltage is less than the third program inhibit bias voltage.

18. The method of claim 16, further comprising causing, by the processing device prior to the bitline setting subphase, the bias voltage with respect to the second dummy wordline and the bias voltage with respect to the third dummy wordline to each be ramped down to 0 V from a second dummy wordline seed voltage and a third dummy wordline seed voltage, respectively.

19. The method of claim 14, further comprising causing, by the processing device, a select gate bias voltage with respect to the select gate to be ramped from 0 V to the power supply voltage either simultaneously with, or after, causing the bias voltage of each dummy wordline of the set of dummy wordlines to be ramped from 0 V to the power supply voltage.

* * * * *